Figure 1:
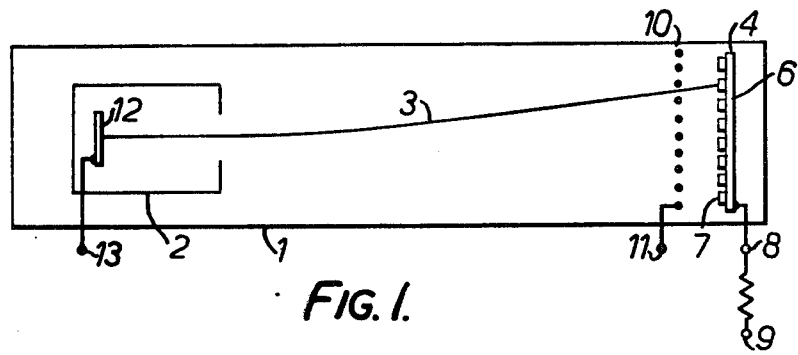

United States Patent [19]

Nixon

[11] 4,004,182
[45] Jan. 18, 1977

[54] OPERATION OF STORAGE TUBES HAVING SECONDARY ELECTRON EMISSIVE TARGETS

[75] Inventor: Ralph Desmond Nixon, Braintree, England

[73] Assignee: English Electric Valve Company Limited, Chelmsford, England

[22] Filed: May 1, 1975

[21] Appl. No.: 573,742

[30] Foreign Application Priority Data

May 2, 1974  United Kingdom ............. 19229/74

[52] U.S. Cl. ..................... 315/12 R; 340/173 CR
[51] Int. Cl.² .......................................... H01J 29/41
[58] Field of Search ............. 315/11, 12, 8; 357/31; 313/377, 379; 340/173 CR

[56] References Cited

UNITED STATES PATENTS

| | | | |
|---|---|---|---|
| 2,726,328 | 12/1955 | Clogston | 315/12 |
| 2,821,653 | 1/1958 | Dyer | 315/11 |
| 3,611,000 | 10/1971 | Johnston | 315/12 |
| 3,774,066 | 11/1973 | Kazan | 315/12 |
| 3,831,054 | 8/1974 | Dorsey et al. | 315/12 |

*Primary Examiner*—Maynard R. Wilbur
*Assistant Examiner*—T. M. Blum
*Attorney, Agent, or Firm*—Baldwin, Wight & Brown

[57] ABSTRACT

A method of operating a storage tube having a secondary electron emissive storage target includes applying selected bias voltages to the target during the writing and erasure steps to control the electron emission ratio, which during writing is less than unity and which during erasure is greater than unity.

This permits the voltage on the target during writing to be of the same order as the voltage present during reading, and this enhances the resolution and performance of the tube.

5 Claims, 5 Drawing Figures

OPERATION OF STORAGE TUBES HAVING SECONDARY ELECTRON EMISSIVE TARGETS

This invention relates to a method of operating a storage tube of the kind having a secondary electron emissive target on which information is stored. The kind of tube to which the invention is especially applicable is exemplified by that made by the present applicants under the trade name "Memicon", one example of which is the subject of the Data Sheet No. EP750. Whilst the known methods of operating storage tubes of this kind are generally quite satisfactory under normal circumstances, the present invention provides a method which offers an improved performance in that stored information is less liable to distortion or degradation.

According to this invention a method of operating an image storage tube in which secondary electrons emitted from a secondary electron emissive target when scanned by a beam of electrons originating from an electron gun are influenced by a potential on a mesh electrode positioned between the target and the electron gun, comprises the steps of writing information in the form of a charge pattern onto said target by superimposing a voltage representative of said information onto a constant bias voltage applied to said target whilst said target is scanned by an electron beam of constant intensity, the value of the bias voltage with respect to the electron gun potential being such that the target exhibits a secondary electron emission ratio of less than unity and the steps of erasing the written information, as and when required, by applying a constant bias potential to the target, the value of which is sufficiently positive with respect to the cathode potential of the electron gun as to produce a secondary electron emission ratio of greater than unity when the target is scanned, whilst a constant bias potential is applied to the said mesh electrode.

By the term "electron gun potential" is meant the potential of the cathode from which the electrons are emitted.

The secondary electron emissive target is usually composed of a mosaic of separate dielectric islands on a conductive back-plate, or alternatively of parallel narrow strips of dielectric material on a conductive back-plate. In each case the said bias voltage and said voltage representative of the information to be written are applied to the conductive back-plate. According to present day practice the dielectric islands or strips are composed of silicon.

Preferably during writing, the mesh electrode is held at a potential which is considerably more positive than the most positive voltage applied to the target.

As the electron beam scans the target, (usually in a raster-like pattern) each point thereof is taken to the cathode potential of the electron gun by the action of the electrons landing.

The electrons landing at each point on the silicon islands produce a net negative charge, which, together with the secondary electron emission ratio of less than unity, produces a pattern of negative charge with respect to the conductive back-plate.

By presenting the information to be written into the storage tube in the form of a signal applied to the conductive back-plate, the disadvantages previously associated with writing methods involving the direct modulation of the scanning electron beam are avoided. In particular, difficulties caused by the very non-linear relationship between the modulating signal and the modulated beam current do not arise.

Preferably the information written into the storage tube is erased, as and when required, by applying a constant bias potential to the target, the value of which is sufficiently positive with respect to the cathode potential of the electron gun as to produce a secondary electron emission ratio of greater than unity when the target is scanned, whilst a constant bias potential is applied to the said mesh electrode. Preferably said constant bias potential holds the mesh substantially at target potential although the use of a relatively small positive or negative potential difference is possible.

As the electron beam scans the target, the secondary electron emission ratio of greater than unity causes a positive voltage drift on the silicon regions which is ultimately limited and stabilised when it reaches the mesh electrode potential.

Usually the whole target would be erased in this way to remove all residual information before new information is written.

The information written into the storage tube in accordance with the present invention may be read out in the conventional manner at present used in connection with "Memicon" tubes.

Figure 2:
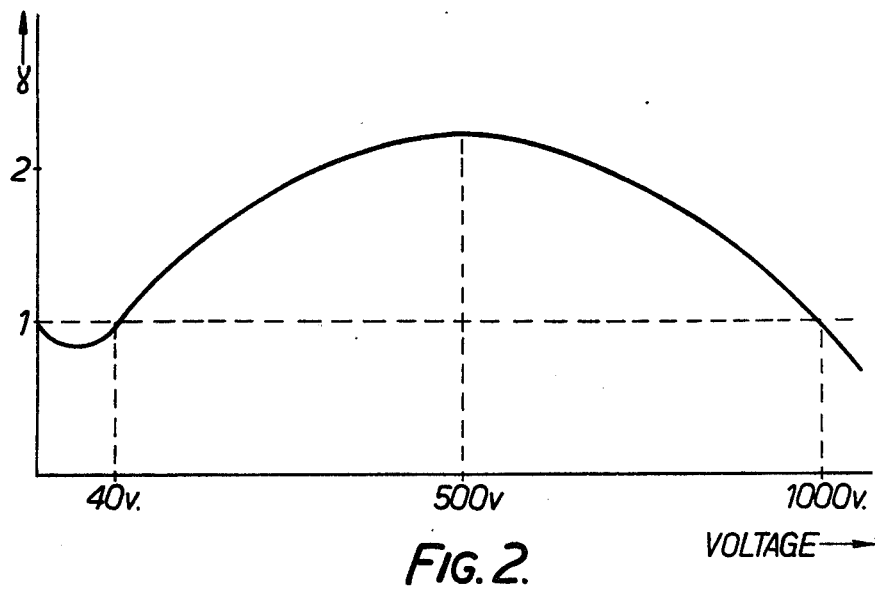
Figure 3:
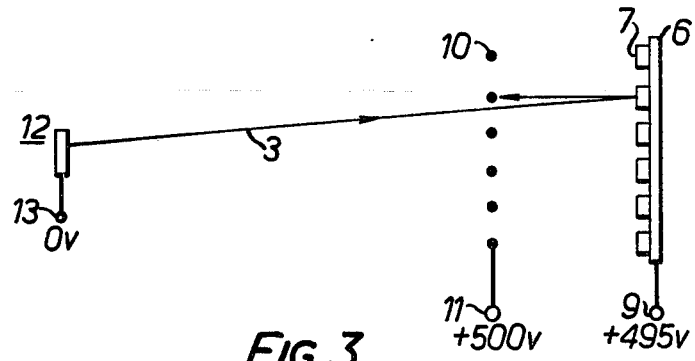
Figure 4:
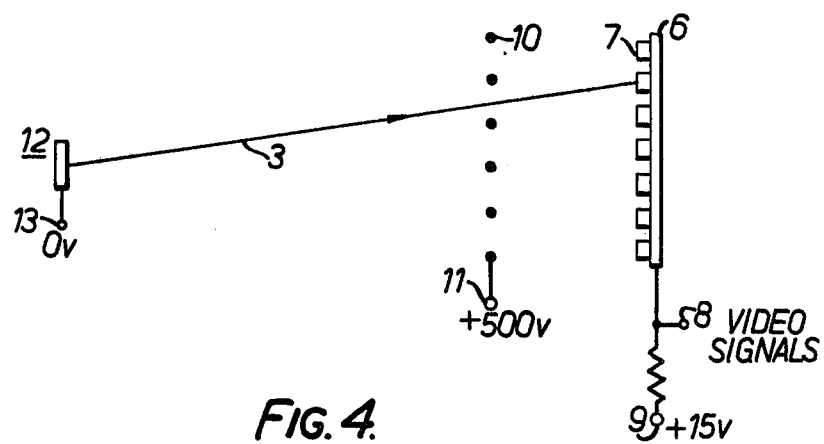
Figure 5:
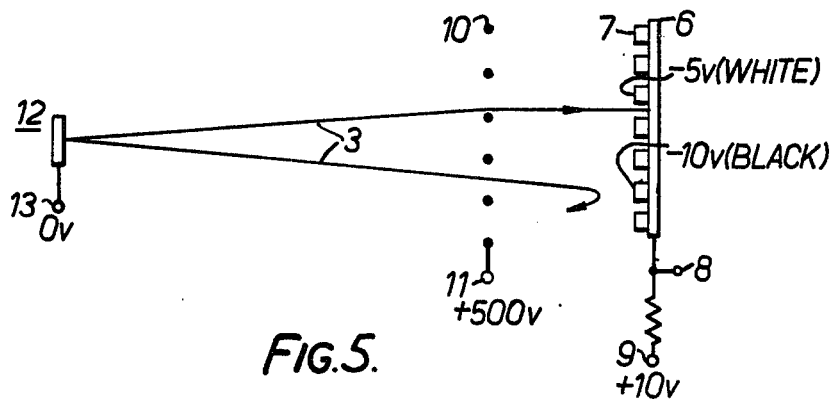

The invention is further described with reference to the accompanying drawings in which, FIG. 1 shows in a much simplified form a storage tube to which the present invention relates, FIG. 2 shows the secondary electron emission characteristics of a target of such a storage tube and, FIGS. 3, 4 and 5 are explanatory diagrams relating to the erase, write and read modes of operation respectively.

Referring to FIG. 1, a storage tube of the kind to which the present invention relates comprises an evacuated envelope 1, having an electron gun 2 arranged to produce an electron beam 3 which scans a target 4 in a raster-like manner. The means for deflecting the electron beam to produce the raster-like pattern are conventional, and could be the same as those used in known vidicon television camera tubes to produce the standard television raster — these deflection means are situated outside the tube envelope 1 and so are not illustrated. Instead of scanning the target with a raster-like pattern, the electron beam may be directly controlled by the deflection means to trace out a line type pattern as required. The target 4 consists of a conductive back-plate 6, the front surface of which is provided with a mosaic of separate silicon insulating islands 7. The back-plate 6 is connected to a terminal 8, and also via a high resistance, (e.g. 50 k$\Omega$) to a further terminal 9.

A mesh electrode 10 is provided just in front of the target 4. It consists of an open conductive mesh and is connected to a terminal 11.

The electron gun 2 is conventional in structure, and is provided with the usual cathode 12, from which the electrons forming the electron beam 3 originate. The cathode 12 is connected to a terminal 13.

It is to be understood that the storage tube itself is that known under, for example, the trade name "Memicon", and which is made by the present applicants, the English Electric Valve Company Limited, and therefore it is not thought necessary to describe the structure of the storage tube itself in greater detail.

The secondary electron emission characteristics of the target 4 is shown in FIG. 2, the voltage scale being that of the target 6 with respect to the cathode 12 of the electron gun 2. From FIG. 2 it will be seen that the effective secondary electron emission ratio γ decreases from unity at zerto volts and reaches a minimum value at about +20 volts, increases to unity at about 40 volts, and continues to increase until a maximum is reached around +500 volts after which it decreases with further increase in target voltage. The foregoing figures are of course merely exemplary and will differ from target to target.

The erase mode is as follows, with reference to particular voltages which are given as typical examples. It is assumed throughout the following description that the voltage present on the cathode 12, i.e. that applied to terminal 13 (neglecting cathode heater connections), is the reference voltage and will taken as zero volts.

The mesh electrode 10 is set to +500 volts, and the back-plate 6 is set to +495 volts, i.e. 5 volts negative with respect to the mesh electrode. Reference to FIG. 2 shows that at these voltages the secondary electron emission ratio is greater than unity, and the effect of scanning the target 4 with the electron beam 3 is to produce a net positive voltage drift on the silicon islands 7 as the secondary electrons are collected by the mesh 10. As the secondary electrons are collected by the more positive mesh 10, the voltage on the silicon islands continues to increase until the mesh potential is reached, at which point it necessarily stabilizes. This process occurs very rapidly as the target is scanned, and after scanning is completed all the silicon islands are at +5 volts with respect to the back-plate 6. The voltages present during the erase step are represented diagrammatically in FIG. 3.

Because the electron beam current available for erasure remains substantially constant during the above described positive voltage drift, complete erasure can be achieved very rapidly, and repeated erasure scans should not be necessary.

During the subsequent writing step, the back-plate 6 is modulated with the information to be written, whilst a constant electron beam current is scanned over its front surface and the silicon islands 7. The information, which is usually representative of picture information, consists of video signals having a peak-to-peak variation of the order of 5 volts. Referring to FIG. 4, during writing the mesh 10 is held at +500 volts as before, and the voltage on the back-plate 6 is varied from +15 volts for "white" signals to +20 volts for "black" signals, the grey scale being represented by the appropriate intermediate values. Since the secondary electron emission ratio is less than unity the electron beam restores the front surface of each silicon island to cathode potential as it scans. The speed at which the video information is applied to the target 4 is synchronised to the scanning rate of the electron beam and after the target has been completely scanned a charge pattern remains which is representative of the information written in (usually picture information).

To enable information subsequently to be read out, the back-plate 6 is held at +10 volts, (see FIG. 5). Those parts of the target carrying "white" information are thus set to −5 volts (with respect to the cathode), and those parts carrying "black" information are set to −10 volts (with respect to the cathode), "grey" information adopting the appropriate intermediate values.

The bias voltage of +10 volts applied to the back-plate 6 is chosen such that the electron beam, whilst enabled to land on the areas of the back-plate 6 in the region of the "white" information areas, is not able to land in the region of the "black" information areas. Thus a current is caused to flow at terminal 8 which is representative of the information stored. It will be noted that the negative values adopted by the silicon islands prevent the electron beam landing on the islands themselves, and the read-out is thus non-destructive.

The invention is of course not restricted to the values of the voltages referred to previously which are given by way of example.

It will be noted that the voltage on the target during the write step are of the same order as those during the read step and this avoids, or at least reduces, the loss of focus, variation in size and shape, and rotation of the stored information that can occur when the voltages are widely different.

I claim:

1. A method of operating an image storage tube in which secondary electrons emitted from a secondary electron emissive target when scanned by a beam of electrons originating from an electron gun are influenced by a potential on a mesh electrode positioned between the target and the electron gun, including the steps of writing information in the form of a charge pattern onto said target by superimposing a voltage representative of said information onto a constant bias voltage applied to said target whilst said target is scanned by an electron beam of constant intensity, the value of the bias voltage with respect to the electron gun potential being such that the target exhibits a secondary electron emission ratio of less than unity, and the steps of erasing the written information, as and when required, by applying a constant bias potential to the target, the value of which is sufficiently positive with respect to the cathode potential of the electron gun as to produce a secondary electron emission ratio of greater than unity when the target is scanned, whilst a constant bias potential is applied to the said mesh electrode.

2. A method as claimed in claim 1 wherein the mesh electrode is held at a potential which is considerably more positive than the most positive voltage applied to the target.

3. A method as claimed in claim 1 wherein, during erasure said constant bias potential holds the mesh substantially at target potential.

4. A method as claimed in claim 1 wherein the whole target is erased to remove all residual information before new information is written.

5. A method of operating an image storage tube in which secondary electrons emitted from a secondary electron emissive target when scanned by a beam of electrons originating from an electron gun are influenced by a potential on a mesh electrode positioned between the target and the electron gun, comprising the steps of:

a. scanning the target with an electron beam of constant intensity from a gun whose cathode is maintained at a fixed reference potential;

b. writing information into the target during scanning as in step (a) by maintaining the mesh electrode at a fixed positive with respect to said reference potential while varying the potential of said target according to the information to be written, the varying potential on the target being established by a fixed bias potential upon which a varying potential is superimposed, and the value of said varying potential being continuously of a value with respect to said reference potential such that the target continuously exhibits a secondary electron emission ratio less than unity; and c. erasing information from the target during scanning as in step (a) by maintaining the mesh electrode at said fixed positive potential while maintaining the target at a fixed potential which is sufficiently positive with respect to said reference potential as to cause said target to exhibit a secondary electron emission ratio greater than unity.

* * * * *